METHOD OF PROVIDING POLYCRYSTALLINE SILICON REGIONS
IN MONOLITHIC INTEGRATED CIRCUITS

Filed Sept. 15, 1970

INVENTOR:
LEONARD STEIN,
BY Robert J. Mooney
HIS ATTORNEY.

United States Patent Office 3,730,765

Patented May 1, 1973

3,730,765
METHOD OF PROVIDING POLYCRYSTALLINE SILICON REGIONS IN MONOLITHIC INTEGRATED CIRCUITS

Leonard Stein, Dewitt, N.Y., assignor to General Electric Company

Filed Sept. 15, 1970, Ser. No. 72,402
Int. Cl. B44d 1/18; M01l 7/16
U.S. Cl. 117—212 6 Claims

ABSTRACT OF THE DISCLOSURE

This invention relates to a method of providing selecviding, within a body of monocrystalline silicon semiconductor material, polycrystalline regions at selected locations. Such regions may consist, for example, of columns or walls extending to the exterior surface from selected internal locations, and may be suitably doped to provide isolation or to provide paths of low resistivity forming low resistance connectors to selected locations within the monocrystalline body.

Figure 1A:
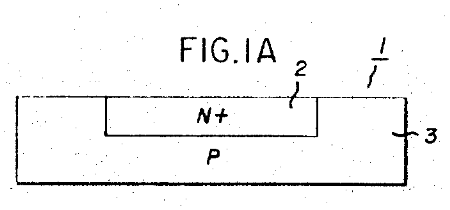

This invention relates to a method of providing selectively located polycrystalline regions, for such purposes as deep collector contacts and isolating regions, in monolithic semiconductor integrated circuits.

In the semiconductor prior art of manufacturing transistors and the like as portions of monolithic semiconductor integrated circuits it is conventional, as an intermediate step in the manufacturing process, to form within the silicon substrate low resistivity N+ (or P+) collector regions which are exposed at the top surface of the substrate. An epitaxial layer is subsequently formed over the top surface of such collector regions, as well as over other portions of the top surface of the substrate, and such collector regions are hence sometimes referred to as "buried." The remaining portions of transistors, including such collector regions, are then formed in the epitaxial layer by diffusion and photolithographic techiques well known in the art.

In order to effectively use a buried collector region formed in the original substrate, it is necessary to provide means for electrically connecting it to a contact on the external surface of the epitaxial layer. The structure thus formed is particularly useful in reducing the saturation resistance of the transistor thus formed, when the collector-base junction of the transistor is forward biased. This saturation resistance is made up of three resistance increments connected in series. The first increment comprises the portion of the epitaxial layer directly below the collector-base junction and extends vertically to the top surface of the buried collector region. The second increment comprises the resistance generated across the horizontal length of the buried collector region between the first portion and the third portion. The third increment comprises the resistance generated by the means used to connect the buried collector region to the external surface of the circuit.

One known method of forming this type of electrical connector comprises the steps of providing an insulating layer over at least part of the external surface of the monocrystalline semiconductor body, forming an aperture in the insulating layer at a selected location above the buried collector region but spaced from the emitter and base regions of the transistor, and diffusing through the aperture impurities forming a region of the same conductivity type material as the buried collector region extending down to the buried collector region through the epitaxial layer.

Unfortunately, this technique requires a long period of diffusion time (for an epi-layer of 16 microns it requires about six hours to make this electrical connection using phosphorus) to reach the buried collector region and, oftentimes, results in deleterious effects on the electrical characteristics of the device. This diffusion technique is also used to form device isolation regions with the exception that the dopant used is of the same conductivity type as the original substrate body of semiconductor material.

Accordingly, it is an object of this invention to provide a method of forming polycrystalline regions at selected locations within a body of monocrystalline silicon semiconductor material which are useful in providing low resistance connectors to selected locations within the monocrystalline body as well as isolation regions in monolithic integrated circuits.

Another object of this invention is to provide a method of forming polycrystalline regions of the foregoing character which is compatible with conventional methods of manufacturing monolithic integrated circuits.

These and other objects of this invention will be apparent from the following description and the accompanying drawing, wherein:

FIGS. 1A–1F illustrate an improved semiconductor device at various stages in the manufacture in accordance with one embodiment of the present invention; and FIGS. 2A–2G illustrate an improved semiconductor device at various stages in the manufacture in accordance with another embodiment of the present invention.

Briefly, this invention relates to a method of forming polycrystalline silicon regions in semiconductor devices. This is accomplished by providing a monocrystalline silicon body including a collector region formed in its top surface. A layer of insulating material such as silicon dioxide is then formed over the entire surface of the body. Using conventional photomasking and etching techniques an aperture is formed in the insulating layer exposing the top surface of the collector region. Subsequently a thin layer of polycrystalline silicon is formed over the entire top surface of the body. A conventional etchant is then used to define a polycrystalline pad over the exposed surfaces and to remove the layer of insulating material. A silicon layer is next epitaxially deposited over the top surface of the silicon body whereby polycrystalline silicon material forms above the polycrystalline pad and monocrystalline silicon material forms above the remaining portions of the top surface of the body.

Referring to FIG. 1A, a body or substrate 3 of monocrystalline semiconductor material such as silicon of one conductivity type (P in this case) is shown having a collector region 2 of opposite conductivity type (in this case N+) formed in its top surface. This is accomplished by conventional masking and diffusion techniques which are well known to those skilled in the art and are not considered part of this invention. The primary purpose of the collector region 2 is to reduce the saturation resistance of the final device, yet to be formed, by providing a more conductive path for the current to follow during the operation of the device when the base-collector junction of a subsequently formed transistor is forward biased. Another benefit of this structure is to reduce the nonsaturated resistance of the device but to a lesser degree.

Figure 1B:
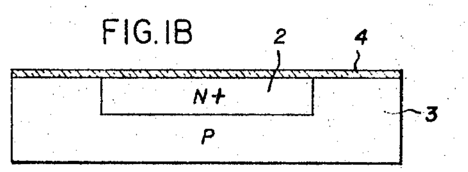

FIG. 1B shows a layer 4 of insulating material such as silicon dioxide, silicon nitride or a combination thereof over the entire top surface of the silicon body 3. This can be accomplished by conventional means well known in the prior art such as pyrolytic deposition and the like. The thickness of the insulating layer is preferably between 2,000 and 10,000 angstroms. It is, of course, recognized that the use of other low-temperature depositions such as glow discharge deposition may also be used to form the insulating layer 4.

Figure 1C:
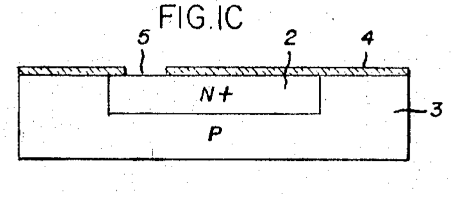

In FIG. 1C an aperture or opening 5 is formed in the insulating layer 4 by photomasking and etching techniques which are well known in the art thereby exposing a portion of the top surface of the collector region 2.

Figure 1D:
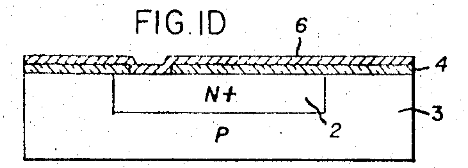

Subsequently, as shown in FIG. 1D, a polycrystalline silicon layer 6 (namely, between 200–1,000 angstroms) is epitaxially deposited, using techniques well known in the prior art, over the top surface of the insulating layer 4 and in the aperture 5. A silicon epitaxial source such as silane or silicon tetrachloride is conventionally used for this purpose.

The polycrystalline silicon layer 6 is formed such that the polycrystalline material covering the insulating layer 4 is sufficiently porous to allow a suitable insulating material etchant to move through these pores to the insulating layer 4. It does not matter that the insulating material etchant can also move through the pores in the polycrystalline material in the aperture 5 to the surface 9 because the etchant selected only attacks the insulating material and not the semiconductor material of collector region 2. It has been found that at thicknesses greater than 1,000 angstroms the polycrystalline layer 6 is not sufficiently porous to allow the etchant to work its way through the pores to the insulating layer 4 in a reasonable time (i.e., less than 15 minutes). Likewise, a thickness of 200 angstroms for the polycrystalline layer 6 is required to assure the quality of any subsequently formed polycrystalline material on top of the portion of layer 6 in aperture 5. It is also theorized that due to the difference in crystal structure of polycrystalline silicon forming on silicon, and the insulating material the portion of the polycrystalline silicon formed in aperture 5 is less porous than the remaining portions of layer 6. This results in the less porous polycrystalline material having a finer grain size which carries over into any subsequently grown polycrystalline material. In this way, a dopant diffused into this polycrystalline material will diffuse faster due to the finer grain size. In addition, it is believed that the polycrystalline silicon in layer 6 forms a better adhesive bond to the silicon surface 9 than to the insulating layer 4.

Figure 1E:
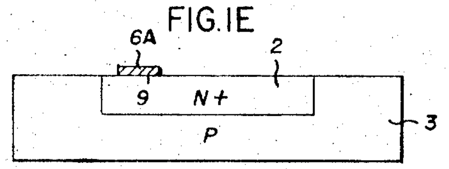

FIG. 1E shows the formation of a polycrystalline pad 6A in the aperture 5. This is accomplished by placing the body 3 shown in FIG. 1D in a suitable insulating layer etchant such as concentrtaed hydrofluoric acid (i.e., 48% HF, 52% $H_2O$). It is theorized that after the etchant works its way through the pores in the polycrystalline layer 6 it etches the insulating layer 4 in such a way that the polycrystalline silicone material 6 on top of the insulating layer 4 is floated off in the etchant solution leaving only the polycrystalline pad 6A remaining.

Figure 1F:
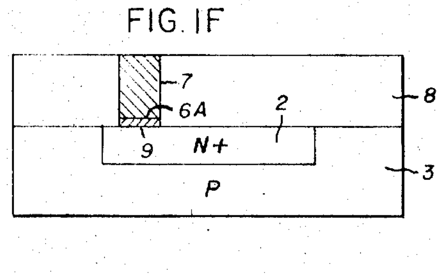

The function of the polycrystalline pad 6A is to act as a nucleation site for subsequently forming polycrystalline silicon material 7 on top of it during a conventional epitaxial deposition step used to form monocrystalline silicon material 8 over the remaining portions of the top surface of the body 3. This is best shown in FIG. 1F. The epitaxial deposition techniques used to form the structure shown in FIG. 1F are well known to those skilled in the art and are not part of this invention.

Upon completion of the formation of the polycrystalline silicon contact region 7 the electrical resistance of contact region 7 is reduced by diffusing into this polycrystalline region a dopant having the same conductivity type as the now buried collector region 2 (in this case N+). This is accomplished by forming an insulating layer over the top surface of the device, opening apertures in the insulating layer to exposed portions of the polycrystalline region 7, depositing a dopant of desired concentration in the aperture and then diffusing the dopant for a time sufficient for the dopant to reach the silicon surface 9. It's also possible that this diffusion step be done simultaneously with the formation of an N+ emitter for an NPN transistor not shown in FIG. 1F because impurity (such as phosphorous) diffusion proceeds faster in polycrystalline silicon material than in monocrystalline silicon material. It is also recognized that when it is desirable to make a deep collector contact to a buried P+ collector region the same technique as above could be used, except a P+ impurity such as boron would be substituted where an N+ impurity was specified.

Figure 2A:
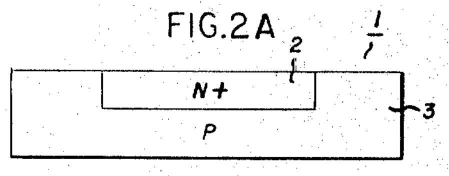
Figure 2B:
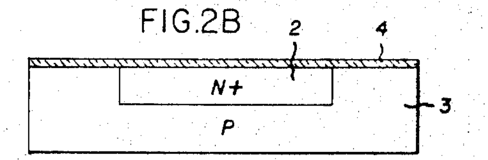
Figure 2C:
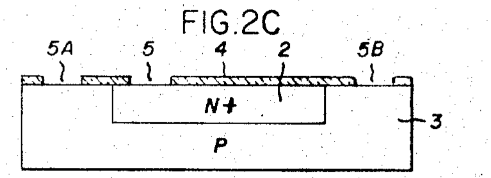

Another embodiment of this invention is shown in FIGS. 2A–2G. This embodiment is one in which device isolation is simultaneously provided at the same time the polycrystalline contact is provided to the collector region 2. The structures shown in FIGS. 2A–2B are formed in the same manner as those shown in FIGS. 1A–1B. At this point, apertures 5, 5A and 5B are formed in the insulating layer 4 thereby exposing portions of the top surface of the collector region 2 and the silicon body 3 as shown in FIG. 2C. The techniques used are the same as those used to form the structure shown in FIG. 1C.

Figure 2D:
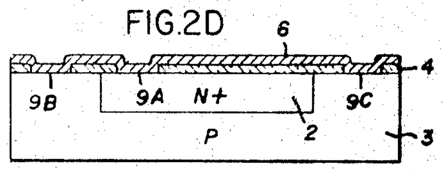

Subsequently, as shown in FIG. 2D, a thin polycrystalline silicon layer 6 (namely, between 200 and 1,000 angstroms) is epitaxially deposited over the top surface of the insulatng layer 4 and in the apertures 5, 5A and 5B. The polycrystalline layer 6 above the insulating layer 4 is sufficiently porous to allow a subsequently used insulating layer etchant to move through these pores in a reasonable length of time, as previously discussed, to etch away the insulating layer 4 and form polycrystalline pads 6A, 6B and 6C.

Figure 2E:
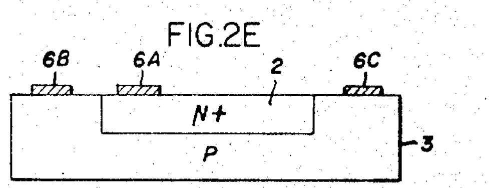
Figure 2F:
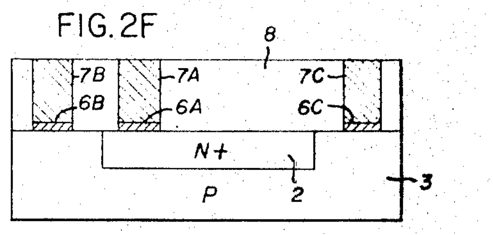

FIG. 2E shows the formation of the polycrystalline pads 6A, 6B and 6C after a similar treatment previously described for step 1E. Thus pads 6A, 6B and 6C will subsequently simultaneously act as nucleation sites for forming the polycrystalline silicon columns 7A, 7B and 7C shown in FIG. 2F. This is accomplished by epitaxially depositing a silicon layer onto the top surface of the silicon body 3. At the same time columns 7A, 7B and 7C are forming, monocrystalline silicon 8 is also forming above those portions of the top surface of the structure not covered by pads 6A, 6B and 6C, as shown in FIG. 2F. Thus, polycrystalline columns 7B and 7C act together to provide device isolation from other devices that may be formed in the siilcon body 3, while polycrystalline column 7A makes contact with the now buried collector region 2. Device isolation is further enhanced via a P+ diffusion from the top of the structure through the polycrystalline columns 7B and 7C to the insulating pads 6B and 6C by techniques well known in the art. It is also possible that this diffusion step be done simultaneously with the formation of a P+ base for an NPN transistor (see, for example, region 16 in FIG. 2B).

Figure 2G:
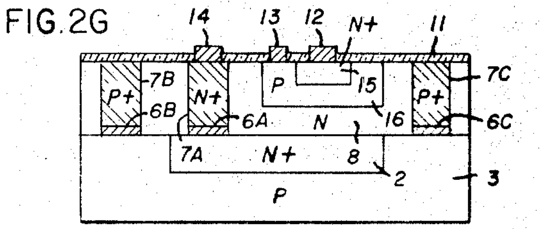

Upon completion of the structure shown in FIG. 2F, subsequent processing steps can be used to further modify the structure as shown in FIG. 2G. Using conventional masking, etching and diffusion steps well known to those skilled in the art, the P+ regions 7B, 16 and 7C are formed as well as N+ regions 7A and 15. Once the regions are formed, contacts are made to regions 7A, 16 and 15 by opening apertures in the insulating layer 11 and depositing a suitable contacting material such as aluminum in the aperture thus forming contact pads 14, 13 and 12 respectively.

It is, of course, recognized that the polycrystalline pad 6A and column 7A could be eliminated for devices not using a collector region 2 and still provide device isolation. In addition, the shape and size of the polycrystalline pads 6A, 6B and 6C and the polycrystalline 7A, 7B and 7C may vary without deviating from the essence of this invention.

It will be appreciated by those skilled in the art that this invention may be carried out in various ways and may take various forms and embodiments other than the illustrative embodiments heretofore described. Accordingly, it is to be understood that the scope of this invention is not limited by the details of the foregoing description, but will be defined in the following claims.

What I claim as new and desire to secure by Letters Patent of the United States is:

1. An improved method of forming a low resistance conductive path from an external surface of a semiconductor device to a collector region spaced inwardly from said surface comprising the steps of:

providing a monocrystalline semiconductor substrate body having in its top surface a collector region of opposite conductivity type than the body;

forming an insulating layer over the top surface of the semiconductor substrate body;

forming an aperture in the insulating layer thereby exposing a portion of the top surface of the collector region;

depositing a thin layer of polycrystalline silicon material between 200 and 1,000 angstroms thick over the entire top surface of the insulating layer and the exposed portions of the collector region wherein the exposed portions of the collector region provide a nucleation site for selective polycrystalline silicon growth during a subsequent epitaxial deposition and wherein the polycrystalline silicon material above the insulating layer is sufficiently porous to allow a subsequently used insulating layer etchant to reach the insulating layer;

placing the body in a suitable insulating layer etchant for a time sufficient to remove the polycrystalline silicon on the top of the insulating layer and the insulating layer itself while essentially keeping intact the polycrystalline silicon formed on the exposed surface of the collector region thereby providing a polycrystalline silicon pad; and epitaxially depositing silicon onto the top surface of the body whereby polycrystalline silicon forms above the polycrystalline silicon pad and monocrystalline silicon forms above the remainder of the top surface of the substrate body to form a flat surface suitable for circuit connections.

2. An improved method of making deep collector contacts as defined in claim 1, wherein after the steps in claim 1 are completed the following steps are added:

forming a second insulating layer over the top surface of the newly deposited polycrystalline and monocrystalline semiconductor material;

forming a second set of apertures in the second insulating layer thereby exposing a portion of the top surface of the newly formed polycrystalline semiconductor material;

depositing the same conductivity type dopant, as that of the now buried collector, into the second set of apertures and diffusing it into said polycrystalline material for a time sufficient to reach the buried collector region thus connecting it to the external surface of the body.

3. An improved method of simultaneously making a deep collector contact and providing device isolation for a monolithic integrated circuit comprising the steps of:

providing a monocrystalline silicon body of one conductivity type having a collector region of opposite conductivity type than the body formed on its top surface;

forming an insulating layer over the top surface of the silicon body;

forming a set of apertures in the insulating layer thereby exposing a portion of the top surface of the collector region and other portions of the silicon body;

depositing a thin layer of polycrystalline silicon material between 200 and 1,000 angstroms thick over the entire top surface of the insulating layer and the exposed surfaces of the collector region and the silicon body wherein the exposed portions of the collector region and the silicon body provide a nucleation site for selective polycrystalline silicon growth during a subsequent epitaxial deposition and wherein the polycrystalline silicon material above the insulating layer is sufficiently porous to allow a subsequently used insulating material etchant to reach the insulating layer;

placing the body in a suitable insulating layer etchant for a time sufficient to remove the polycrystalline silicon on top of the insulating layer and the insulating layer itself while essentially keeping intact the polycrystalline silicon formed on the exposed surfaces of the collector region and the silicon body thereby providing polycrystalline silicon pads on these exposed surfaces; and epitaxially depositing silicon onto the silicon body whereby a polycrystalline silicon material forms above the polycrystalline silicon pads and monocrystalline silicon forms above the remainder of the top surface of the substrate body to form a flat surface suitable for circuit connections.

4. An improved method of simultaneously making a deep collector contact and providing device isolation for a monolithic integrated circuit as defined in claim 3, wherein after the steps of claim 3 are completed the following steps are added:

forming a second insulating layer over the top surface of the newly deposited polycrystalline and monocrystalline semiconductor material;

forming a second set of apertures in the second insulating layer thereby exposing a portion of the top surface of the newly formed polycrystalline semiconductor material above the now buried collector region; and depositing the same conductivity type dopant, as that of the now buried collector region, into the second set of apertures and diffusing it into the exposed top surface of the polycrystalline material for a time sufficient to reach the buried collector region thus connecting it to the external surface of the body.

5. An improved method of providing device isolation for a monolithic integrated circuit comprising the steps of:

providing a body of monocrystalline silicon material;

forming an insulating layer over the top surface of the silicon body;

forming a set of apertures in the insulating layer thereby exposing a portion of the top surface of the silicon body;

depositing a thin layer of polycrystalline silicon material between 200 and 1,000 angstroms thick over the entire top surface of the insulating layer and the exposed portions of the silicon body wherein the exposed portions of the silicon body provide a nucleation site for selective polycrystalline silicon growth during a subsequent epitaxial deposition and wherein the polycrystalline silicon material above the insulating layer is sufficiently porous to allow a subsequently used insulating layer etchant to reach the insulating layer;

placing the body in a suitable insulating layer etchant for a time sufficient to remove the polycrystalline silicon on top of the insulating layer and the insulating layer itself, while essentially keeping intact the polycrystalline silicon formed on the exposed surface of the silicon body thereby providing polycrystalline silicon pads; and epitaxially depositing silicon onto the top surface of the body whereby polycrystalline silicon forms above the polycrystalline silicon pads and monocrystalline silicon forms above the remainder of the top surface of he substrate body to form a flat surface suitable for circuit connections.

6. An improved method of providing device isolation for a monolithic integrated circuit as defined in claim 5, wherein after the steps in claim 5 are completed the following steps are added:

forming a second insulating layer over the top surface of the newly deposited polycrystalline and monocrystalline semiconductor material;

forming a second set of apertures in the second insulating layer thereby exposing a portion of the top surface of the newly formed polycrystalline semiconductor material;

depositing the same conductivity type dopant, as that of the silicon body, into the second set of apertures and diffusing it into said polycrystalline material for a time sufficient to reach the polycrystalline silicon pads thus connecting the now buried silicon body to the external surface of the body.

References Cited

UNITED STATES PATENTS

| | | | |
|---|---|---|---|
| 3,326,729 | 6/1967 | Sigler | 96—36.2 X |
| 3,189,973 | 6/1965 | Edwards et al. | 148—174 |
| 3,519,901 | 7/1970 | Bean et al. | 148—174 X |
| 3,549,432 | 12/1970 | Sivertsen | 148—175 |

ALFRED L. LEAVITT, Primary Examiner

K. P. GLYNN, Assistant Examiner

U.S. Cl. X.R.

117—215; 148—174; 156—17; 317—234 M